United States Patent
Shields et al.

(10) Patent No.: US 6,174,819 B1
(45) Date of Patent: Jan. 16, 2001

(54) LOW TEMPERATURE PHOTORESIST REMOVAL FOR REWORK DURING METAL MASK FORMATION

(75) Inventors: Jeffrey Allan Shields, Sunnyvale; Lewis Shen, Cupertino; Anne E. Sanderfer, Campbell, all of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/119,777

(22) Filed: Jul. 21, 1998

(51) Int. Cl.[7] .................................................. H01L 21/461

(52) U.S. Cl. .......................... 438/745; 438/637; 438/648; 438/746; 438/754

(58) Field of Search ..................................... 438/637, 648, 438/745, 746, 754

(56) References Cited

U.S. PATENT DOCUMENTS 5,795,702 * 8/1998 Tanabe et al. ........................ 430/331
6,027,861 * 8/1998 Yu et al. ............................... 430/316

* cited by examiner

*Primary Examiner*—David Nelms
*Assistant Examiner*—Quoc Hoang

(57) ABSTRACT

A defective photoresist mask is removed from a metal layer prior to etching by low-temperature processing to minimize or substantially eliminate any resulting residue on the metal layer, thereby enabling the formation of an interconnection pattern with minimal defects. Embodiments include removing the defective mask by applying a solvent at a temperature of about 80° C. or less, forming a new photoresist mask, and etching the underlying metal layer. The substantial elimination of residue on the metal layer prior to etching avoids bridging between resulting interconnection lines and, hence, short circuiting and device failure.

12 Claims, 5 Drawing Sheets

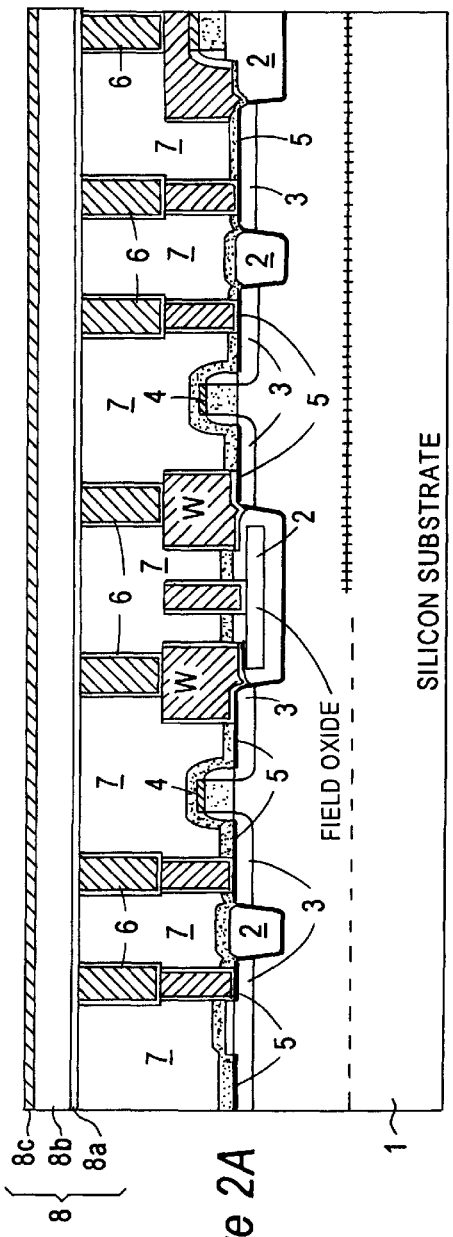
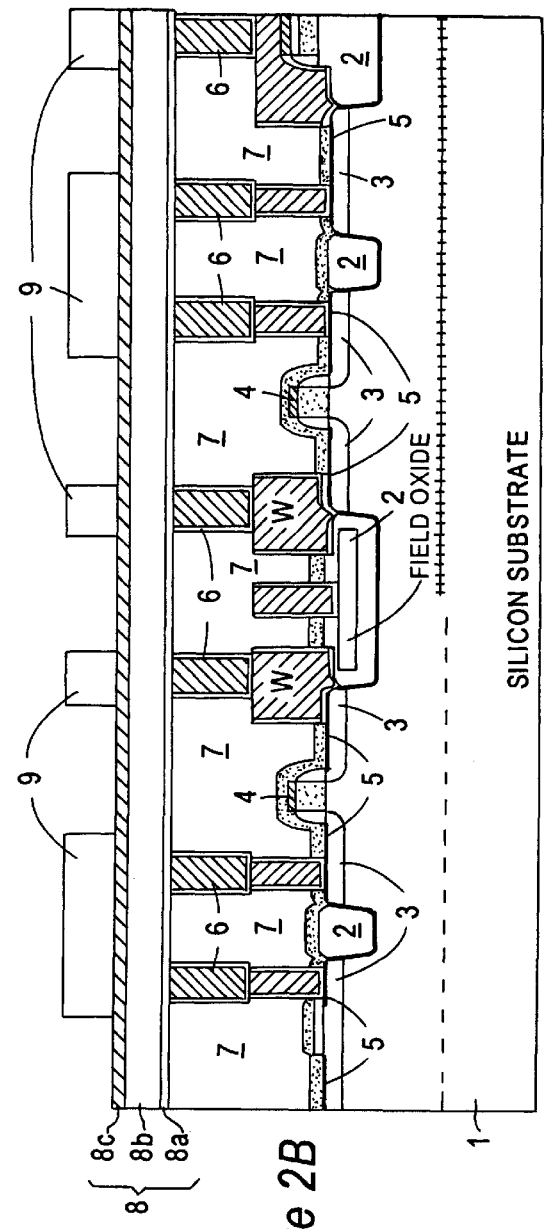
Figure 2A
Figure 2B

LOW TEMPERATURE PHOTORESIST REMOVAL FOR REWORK DURING METAL MASK FORMATION

FIELD OF THE INVENTION

The present invention relates to a method of manufacturing a semiconductor device comprising patterned metal interconnections. The invention has particular applicability in manufacturing high density semiconductor devices with submicron patterned metal features for local and global interconnections.

BACKGROUND ART

Current demands for high density and performance associated with ultra large scale integration require submicron features of about 0.25 microns and under, increased transistor and circuit speeds and improved reliability. Such demands for increased density, performance and reliability require device features with high precision and uniformity.

Conventional semiconductor devices comprise a substrate and various electrically isolated regions, called active regions, in which individual circuit components, such as transistors comprising gates and source/drain regions, are formed and interconnected. In one interconnection scheme, source/drain regions and gates of neighboring transistors are connected to one another by local interconnections to form "standard cells" which, in turn, are connected to each other locally and globally by several patterned metal layers interleaved with dielectric layers formed above and extending substantially horizontally with respect to the substrate surface. The metal layers are connected to one another and to the local interconnections by vias.

Conventional practices comprise depositing a composite three-layer metal stack comprising an upper layer of titanium nitride (TiN) or titanium—titanium nitride (Ti—TiN), an intermediate aluminum (Al) or Al alloy layer and a lower layer of titanium (Ti) or Ti—TiN, as by sputtering. A patterned photoresist mask is then formed on the metal layer defining a metal pattern and the underlying metal is etched to form the pattern of metal lines. The quality of the photoresist mask is crucial to the definition of the metal interconnect layer and, hence, to device performance. Thus, if defects are observed or detected in the mask, it must be removed and replaced with a defect free mask before etching. Conventional photoresist mask removal techniques include subjecting the wafer to oxygen plasma stripping at about 240° C. to about 260° C., followed by solvent cleaning. A new patterned photoresist mask is then formed on the underlying metal layer and etching is conducted to form the patterned metal lines.

After investigation, it was found that wafers which were processed by such conventional defective mask removal and replacement procedures exhibit an abnormally high defect density during the subsequent metal etch, due to the presence of residue in between the etched metal lines. The impact of stripping residue is illustrated in FIG. 1, depicting substrate 1, field oxide 2, device components 3, 4, local interconnect 5, contacts 6, insulating material 7, metal lines 8 and residue R. It is believed that residue R forms a conductive bump on insulating material 7 which causes "bridging" between adjacent metal lines 8 and, hence, short circuiting and device failure. Some residue R can be formed even if the photoresist is not replaced; however, it was found that conventional photoresist mask replacement generates a considerably greater amount of conductive residue causing a high reject rate.

There exists a need for semiconductor methodology enabling replacement of a defective photoresist mask, then subsequently etching an underlying metal layer, without encountering short circuiting between resulting metal lines due to conductive residue. There exists a particular need for such photoresist mask rework methodology in manufacturing high density devices having minimal interwiring spaces.

SUMMARY OF THE INVENTION

An object of the present invention is a method of replacing a defective photoresist mask and etching to form a high integrity interconnection pattern.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having metal interconnections, which method comprises substantially removing a defective photoresist mask having a pattern on a metal layer by applying a solvent thereto at a temperature of about 80° C. or less.

Another aspect of the present invention is a method of manufacturing a semiconductor device having metal interconnections on an upper surface, which method comprises: sputter depositing a titanium layer having a thickness of about 250 Å on the upper surface; sputter depositing a layer of an aluminum alloy containing about 1% copper having a thickness of about 4000 Å to about 8000 Å on the titanium layer; sputter depositing a titanium nitride layer having a thickness of about 500 Å or about 1100 Å on the aluminum alloy layer; forming a first photoresist mask having a pattern and having a thickness of about 1.0 μm to about 1.4 μm on the titanium nitride layer; detecting a defect on the first photoresist mask; substantially removing the first photoresist mask by applying a solvent thereto at a temperature of about 70° C. to about 80° C.; forming a second photoresist mask having the pattern at a thickness of about 1.0 μm to about 1.4 μm on the titanium nitride layer; and etching the titanium nitride, aluminum and titanium layers to form metal interconnections.

A still further aspect of the present invention is a method of manufacturing a semiconductor device having metal interconnections on an upper surface, which method comprises: removing a portion of a defective photoresist mask on a metal layer by oxygen plasma stripping at a temperature of about 150° C. or less leaving a remaining portion; and substantially removing the remaining portion of the defective photoresist mask by applying a solvent thereto at a temperature of about 80° C. or less.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 2A–2E schematically illustrate sequential phases of a method in accordance with an embodiment of the present invention.

DESCRIPTION OF THE INVENTION

The present invention addresses and solves problems stemming from the replacement of a defective photoresist mask on a metal layer with a substantially nondefective photomask and etching the underlying metal layer to form patterned metal interconnect lines. As a result of conventional rework, a conductive residue is generated which causes bridging and short circuiting between the metal lines, particularly metal lines with submicron interwiring spacings, thereby causing device failure and reducing manufacturing throughput. The present invention addresses and solves such problems with methodology enabling removal of a defective photoresist mask from a metal layer without substantial generation of residue, thereby significantly reducing or eliminating bridging which leads to short circuiting and device failure.

According to the present invention, a photoresist mask is formed on a metal layer, such as a three-layer metal stack comprising a top layer of TiN, an intermediate layer of an Al alloy containing about 1% Cu, and a bottom layer of Ti which, in turn, is typically formed on a dielectric layer. Upon observing or detecting that the photoresist mask is defective, it is substantially entirely removed by applying a solvent thereto at a relatively low temperature, such as about 80° C. or less. A new, substantially defect free photoresist mask is then formed on the metal layer and etching is conducted to form metal interconnections with a dramatically decreased level of defects compared to those formed employing conventional mask rework processes. It is believed that the relatively high temperatures (about 240° C. to about 260° C.) used in conventional photoresist stripping techniques, alone or in combination with the oxygen plasma stripping process, adversely affect the metal layer, particularly the uppermost (TiN) layer of the metal stack and/or the interface between the TiN and the underlying Al layer, thereby forming a conductive residue which promotes bridging and short circuiting. The present invention substantially reduces or avoids the formation of conductive residue by stripping the photoresist at a relatively low temperature, which also simplifies photoresist removal. Thus, the inventive methodology advantageously provides an efficient, cost-effective way to replace a defective photoresist mask from a metal layer while avoiding the generation of conductive residue which leads to bridging in the patterned metal layer and short circuiting.

In another embodiment of the present invention, the defective photoresist mask is removed by oxygen plasma stripping at a temperature of about 150° C. or less, and then applying a solvent at about 80° C. or less to substantially remove any remaining photoresist. Due to the reduction in temperature of the plasma stripping phase compared to conventional techniques, bridging between metal lines is dramatically reduced.

Figure 1:
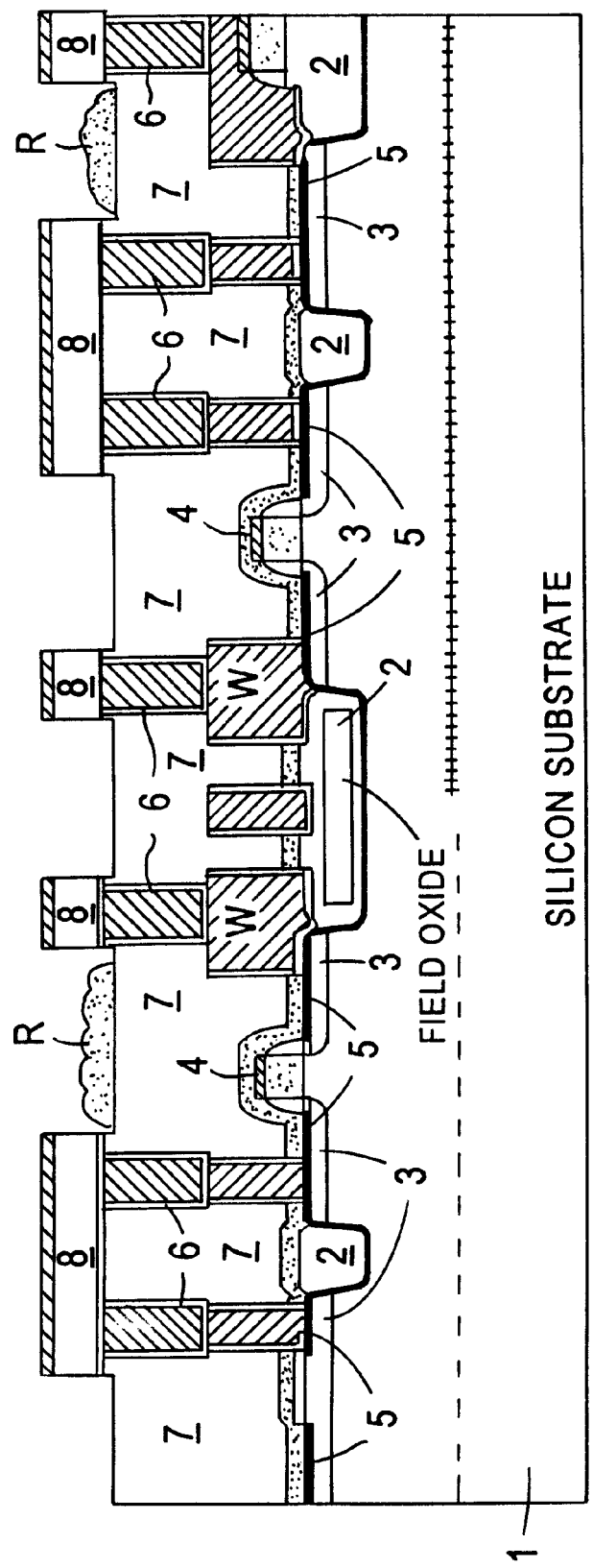
FIG. 1 schematically illustrates a semiconductor device with undesirable conductive residue between metal interconnection lines.
Figure 2C:
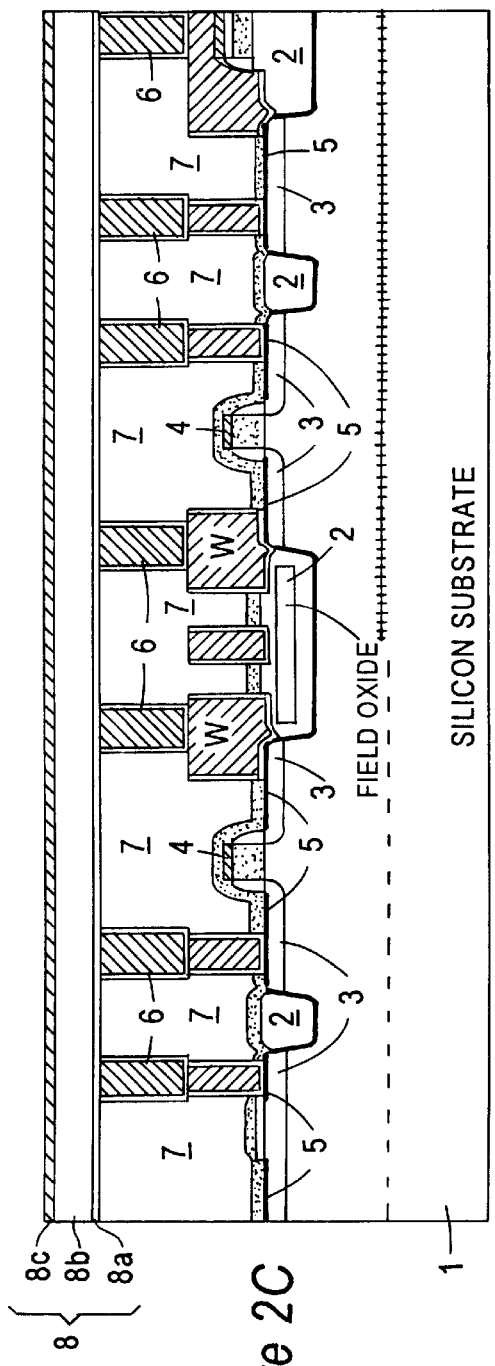

An embodiment of the present invention is illustrated in FIGS. 2A–2E, wherein sequential phases in forming a semiconductor device in accordance with the present invention are depicted. Referring to FIG. 2A, field oxide areas 2 are formed, as by shallow trench isolation techniques; source/drain regions 3 are formed by implantation of impurities; gates 4 are formed on the substrate 1; source/drain regions 3 and gates 4 are connected by local interconnects 5 such as tungsten (W); and contacts 6 such as W and TiN are formed separated by insulating material 7.

A three-layer metal stack 8 is then deposited by sputtering. The bottom layer 8a of the stack 8 comprises Ti having a thickness of about 250 Å. Ti layer 8a improves electromigration resistance and provides a desirable metal grain structure. The intermediate layer 8b is the primary conductor, and comprises Al with trace amounts of copper (e.g., about 1% copper) having a thickness of about 4000 Å to about 8000 Å. The top layer 8c comprises TiN and acts as an anti-reflective coating for photolithographic processing as well as an etch stop during a subsequent via etching process. Top layer 8a can have a thickness of about 500 Å or about 1100 Å.

After formation of the metal stack 8, a patterned photoresist mask 9 is formed on titanium nitride layer 8c, as shown FIG. 2B. Photoresist mask 9 has a thickness of about 1.0 μm to about 1.4 μm. Photoresist mask 9 is then inspected, and if it is found to be defective, a solvent, such as ACT 935, is applied to mask 9 at a temperature of about 80° C. or less, preferably about 70° C. to about 80° C., to substantially entirely remove it from the metal stack 8, as illustrated in FIG. 2C.

Figure 2D:
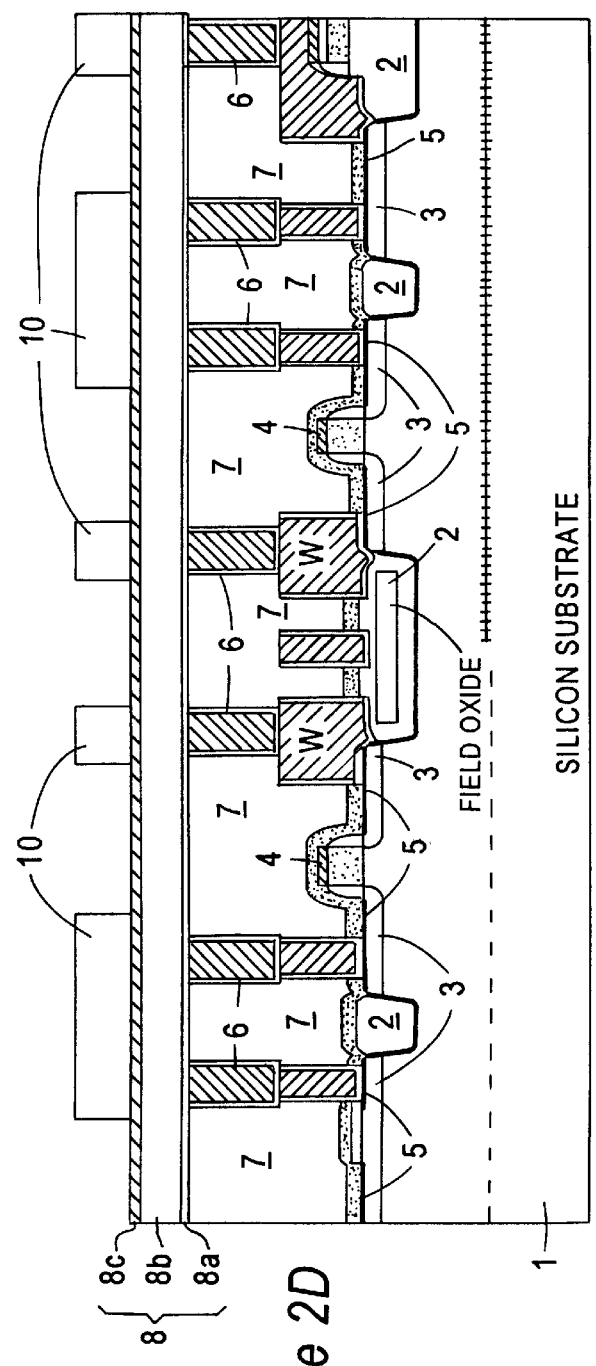
Figure 2E:
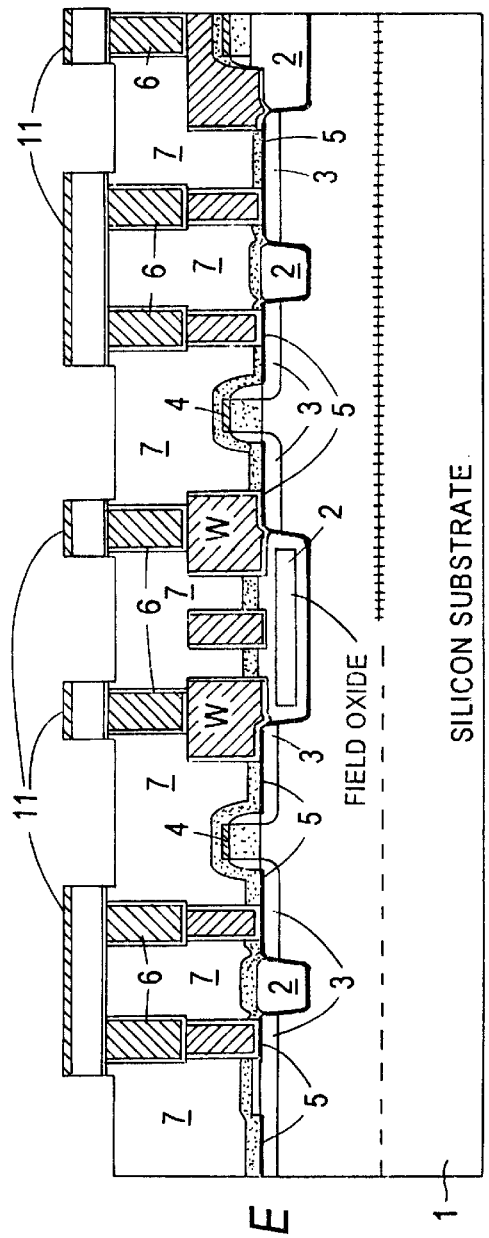

Subsequently, as shown in FIG. 2D, a second photoresist mask 10 is formed on titanium nitride layer 8c and, if it is found to be substantially free of defects, etching of metal stack 8 is carried out to form metal interconnections 11, as illustrated in FIG. 2E, without generating any or an excessive amount of residue.

Figure 3A:
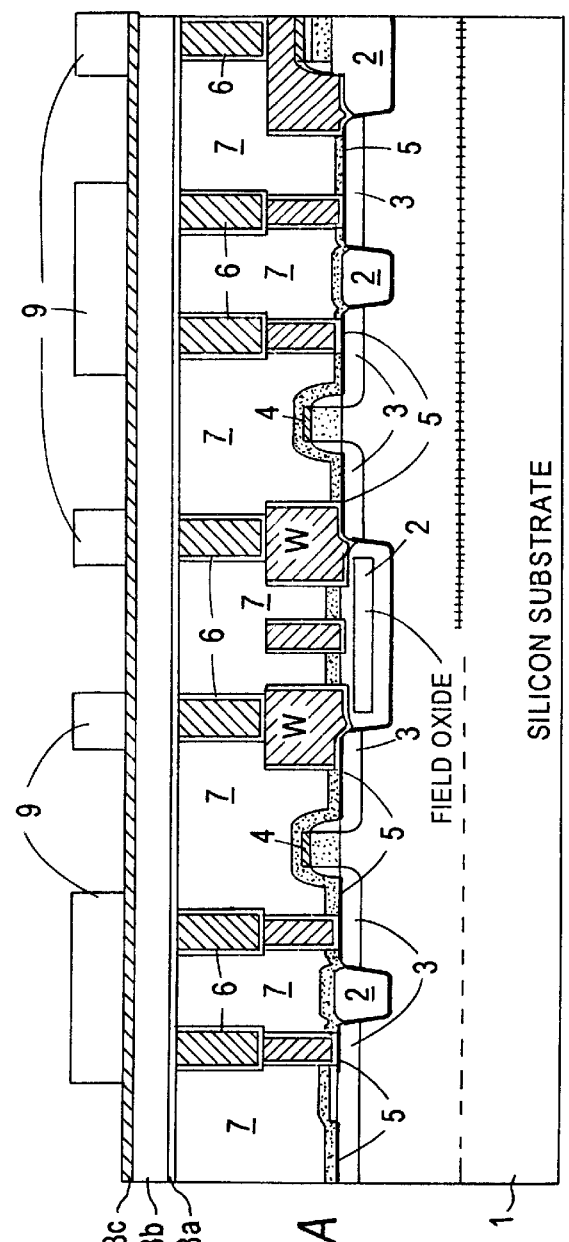
FIGS. 3A–3C schematically illustrate sequential phases of a method in accordance with a second embodiment of the present invention.
Figure 3B:
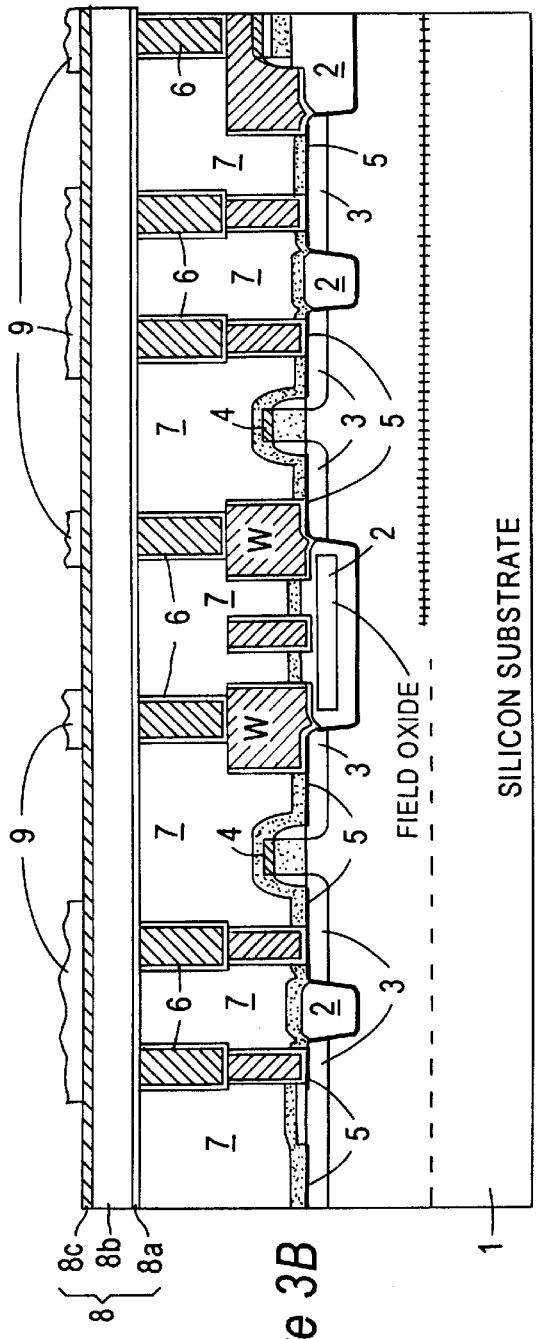
Figure 3C:
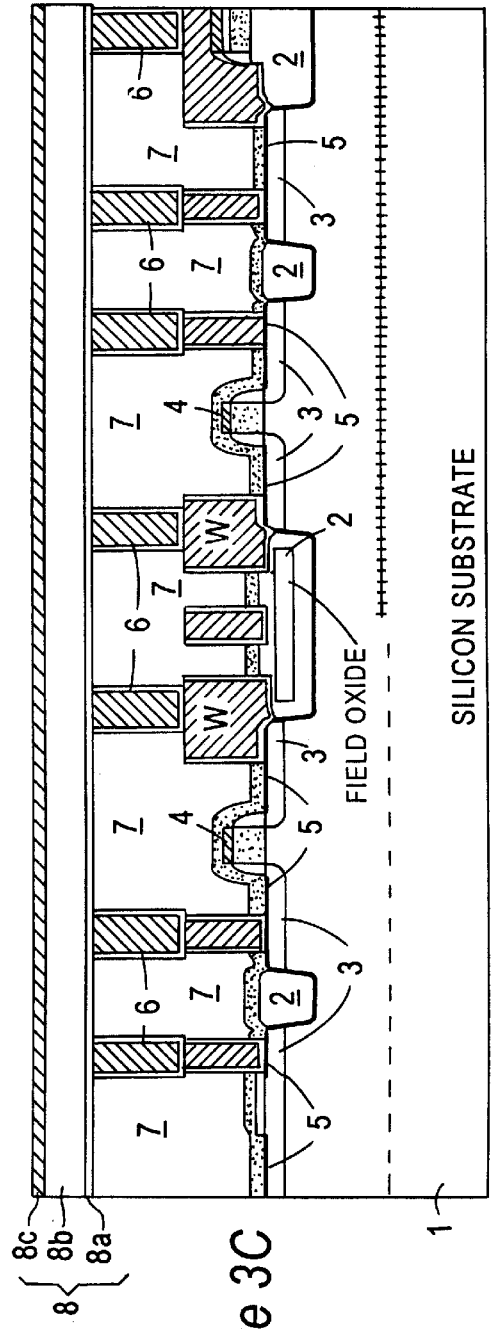

FIGS. 3A–3C depict sequential phases in forming a semiconductor device in accordance with another embodiment of the present invention. Referring to FIG. 3A, a metal layer 8 and a photoresist mask 9 are formed as in the embodiment depicted in FIGS. 2A–2B. In this embodiment, if the photoresist mask 9 is found to be defective, it is removed using a two-step process. First, a portion of the mask 9 is removed by oxygen plasma stripping at a temperature of about 150° C. or less, preferably about 120° C. to about 150° C., as shown in FIG. 3B. Then, a solvent, such as ACT 935, is applied at about 80° C. or less, preferably about 70° C. to about 80° C., to substantially entirely remove that portion of the photoresist mask 9 not removed by the oxygen plasma stripping, as shown in FIG. 3C.

Subsequently, as in the embodiment depicted in FIG. 2D, a second photoresist mask 10 is formed on TiN layer 8c and, if it is not found defective, etching of metal stack 8 is carried out to form metal interconnections 10, as illustrated in FIG. 2E, without generating any substantial amount of conductive residue.

The photoresist mask removal process carried out in accordance with the present invention is characterized by the substantial absence of conductive residue on the top metal layer. As a result, the present invention advantageously reduces the amount of bridging in subsequently formed metal lines, thereby avoiding short circuiting and device failure. The present invention is applicable to the manufacture of various types of semiconductor devices having patterned metal interconnections, particularly high density semiconductor devices having a design rule of about 0.25 μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having metal interconnections on an upper surface, which method comprises:

sputter depositing a titanium layer having a thickness of about 250 Å on the upper surface;

sputter depositing a layer of an aluminum alloy containing about 1% copper having a thickness of about 4000 Å to about 8000 Å on the titanium layer;

sputter depositing a titanium nitride layer having a thickness of about 500Å or about 1100 Å on the aluminum alloy layer;

forming a first photoresist mask having a pattern and having a thickness of about 1.0 μm to about 1.4 μm on the titanium nitride layer;

detecting a defect in the first photoresist mask;

removing a portion of the first photoresist mask by oxygen plasma stripping at a temperature of about 150° C. or less leaving a remaining portion;

substantially removing the remaining portion of the first photoresist mask by applying a solvent thereto at a temperature of about 70° C. to about 80° C.;

forming a second photoresist mask having the pattern at a thickness of about 1.2 μm on the titanium nitride layer; and etching the titanium nitride, aluminum and titanium layers to form metal interconnections.

2. A method of manufacturing a semiconductor device having metal interconnections on an upper surface, which method comprises:

removing a portion of a defective photoresist mask on a metal layer by oxygen plasma stripping at a temperature of about 150° C. or less leaving a remaining portion; and substantially removing the remaining portion of the defective photoresist mask by applying a solvent thereto at a temperature of about 80° C. or less.

3. The method according to claim 2, comprising performing the oxygen plasma stripping using a microwave stripper.

4. The method according to claim 2, comprising performing the oxygen plasma stripping at a temperature of about 120° C. to about 150° C.

5. The method according to claim 2, comprising applying the solvent at a temperature of about 70° C. to about 80° C.

6. The method according to claim 2, wherein the photoresist mask has a thickness of about 1.0 μm to about 1.4 μm.

7. The method according to claim 6, wherein the metal layer is a composite comprising a top layer of titanium nitride, an intermediate layer of an aluminum alloy containing about 1% copper and a bottom layer of titanium.

8. The method according to claim 7, wherein the top layer has a thickness of about 500 Å or a thickness of about 1100 Å.

9. The method according to claim 7, wherein the intermediate layer has a thickness of about 4000 Å to about 8000 Å.

10. The method according to claim 7, wherein the bottom layer has a thickness of about 250 Å.

11. The method according to claim 7, wherein the top, intermediate and bottom layers are deposited by sputtering.

12. The method according to claim 2, comprising:

forming a second photoresist mask having the pattern on the metal layer after applying the solvent; and etching the metal layer to form the metal interconnections.

* * * * *